United States Patent
Cho

[19]

[11] Patent Number: 6,096,592
[45] Date of Patent: Aug. 1, 2000

[54] METHODS OF FORMING INTEGRATED CIRCUIT CAPACITORS HAVING PLASMA TREATED REGIONS THEREIN

[75] Inventor: Hag-Ju Cho, Seoul, Rep. of Korea

[73] Assignee: Samsung Electronics Co., Ltd., Rep. of Korea

[21] Appl. No.: 09/022,311

[22] Filed: Feb. 11, 1998

[30] Foreign Application Priority Data

Feb. 17, 1997 [KR] Rep. of Korea .......................... 97-4774
Nov. 12, 1997 [KR] Rep. of Korea ....................... 97-59413

[51] Int. Cl.[7] .............................................. H01L 21/8234
[52] U.S. Cl. .............................. 438/238; 438/3; 438/239; 438/240; 438/253; 438/254; 438/396; 438/397
[58] Field of Search .............................. 438/3, 238, 239, 438/240, 253, 254, 396, 397; 257/295, 296, 300

[56] References Cited

U.S. PATENT DOCUMENTS

| | | | |
|---|---|---|---|
| 5,305,178 | 4/1994 | Binder et al. ............................. | 361/323 |
| 5,307,304 | 4/1994 | Saito et al. ............................... | 365/145 |
| 5,468,687 | 11/1995 | Carl et al. ................................. | 437/235 |
| 5,496,410 | 3/1996 | Fukuda et al. ................... | 118/723 MW |
| 5,541,807 | 7/1996 | Evans, Jr. et al. .................... | 361/321.5 |
| 5,562,952 | 10/1996 | Nakahigashi et al. .................. | 427/534 |
| 5,573,979 | 11/1996 | Tsu et al. ................................. | 437/195 |
| 5,629,888 | 5/1997 | Saito et al. ............................... | 365/145 |

FOREIGN PATENT DOCUMENTS

| | | |
|---|---|---|
| 06021333 B1 | 1/1994 | Japan . |
| 07014986 B1 | 1/1995 | Japan . |

OTHER PUBLICATIONS

Y. Ohji et al., $Ta_2O_5$ Capacitors' Dielectric Material For Giga–Bit DRAMs, 1995 IEEE, IEDM, 5.1.1–5.1.4, pp. 111–114.

*Primary Examiner*—Matthew Smith
*Assistant Examiner*—Belur D Keshaven
*Attorney, Agent, or Firm*—Myers Bigel Sibley & Sajovec

[57] ABSTRACT

Methods of forming integrated circuit capacitors include the steps of forming a capacitor comprising first and second electrodes and a dielectric layer between the first and second electrodes, on a substrate. A step is then performed to expose at least one of the dielectric layer and the second electrode to an ECR plasma for a duration of sufficient length to improve charge leakage characteristics of the integrated circuit capacitor. The dielectric layer may comprise STO, BST, PZT, SBT PLZT and BTO, for example. This exposing step may include the step of selectively exposing the second electrode, but not the ferroelectric dielectric layer, to the ECR plasma. The exposing step also preferably includes simultaneously maintaining the substrate at a temperature below about 700° C.

42 Claims, 6 Drawing Sheets

METHODS OF FORMING INTEGRATED CIRCUIT CAPACITORS HAVING PLASMA TREATED REGIONS THEREIN

FIELD OF THE INVENTION

The present invention relates to methods of forming integrated circuits, and more particularly to methods of forming capacitors for integrated circuits.

BACKGROUND OF THE INVENTION

As semiconductor devices becomes more highly integrated, the area allocated for forming capacitors within the devices typically becomes reduced and therefore it may be difficult to obtain required capacitance levels. Also, it is difficult to form conventional NO or $Ta_2O_5$ films having reduced thicknesses in order to increase capacitance levels. Even in the event a thin film can be formed, it may be difficult to secure the desired capacitance levels because the use of thin films may result in increased leakage currents. In order to solve the above problems, methods for shaping a storage electrode of a capacitor in three-dimensional cylinder or fin forms have been proposed. However, these methods for shaping storage electrodes may be difficult to apply to highly-integrated semiconductor devices.

Therefore, research into capacitors having dielectric layers comprising high dielectric materials such as BST and PZT and metal electrodes formed of platinum group elements that are compatible with these high dielectric materials, has been actively pursued. The thickness of a BST layer, which is a high dielectric material, should not exceed a predetermined level when using it as the capacitor dielectric material of a highly-integrated semiconductor device. As will be understood by those skilled in the art, integrated circuit capacitors typically require thermal treatment at high temperatures so that preferred crystalline properties of the dielectric layer and stable leakage current characteristics can be obtained. Therefore, the use of high dielectric layers and high temperature treatment of capacitor leads to the formation of capacitors with improved leakage current characteristics.

To address limitations associated with conventional methods, a method of processing a surface of a $Ta_2O_5$ dielectric layer with a plasma or radical annealing technique using $O_2$ is disclosed in an article by Y. Ohji et al. entitled "$Ta_2O_5$ capacitors' dielectric material for Giga-bit DRAMs" IEDM, pp. 111–114 (1995). In particular, the Ohji et al. article discloses that hydrocarbon contamination can be oxidized and then eliminated using plasma or radical annealing. U.S. Pat. No. 5,305,178 to Binder et al. also discloses a technique of increasing the electrical breakdown strength of capacitors by exposing a capacitor dielectric to a low temperature, low pressure plasma. Notwithstanding these attempts, there continues to be a need for improved methods of forming capacitors for highly integrated circuits.

SUMMARY OF THE INVENTION

It is therefore an object of the present invention to provide improved methods of forming integrated circuit capacitors.

It is another object of the present invention to provide methods of forming integrated circuit capacitors having improved leakage current characteristics.

It is still another object of the present invention to provide methods of forming integrated circuit capacitors having high capacitance values.

These and other objects, advantages and features of the present invention are provided by methods of forming integrated circuit capacitors which include the steps of forming a capacitor comprising first and second electrodes and a dielectric layer between the first and second electrodes, on a substrate. A step is then performed to expose at least one of the ferroelectric dielectric layer and the second electrode to an ECR plasma for a duration of sufficient length to improve charge leakage characteristics of the integrated circuit capacitor. The dielectric layer may comprise STO, BST, PZT, SBT PLZT and BTO, for example. This exposing step may include the step of selectively exposing the second electrode, but not the dielectric layer, to the ECR plasma. The exposing step also preferably includes simultaneously maintaining the substrate at a temperature below about 700° C.

According to a preferred aspect of the present invention, the ECR plasma comprises an ECR microwave plasma that is supplied with at least 0.1 kWatts of power and has a frequency of 2.45 GHz. The ECR plasma is also preferably established using a source gas comprising a compound selected from the group consisting of $N_2O$, $O_2$, $O_3$, CO and $CO_2$. In addition, the source gas may also comprises a compound selected from the group consisting of Ar, $N_2$, He and $NH_3$. Preferably, the source gas comprises $N_2O+N_2$, $N_2O+NH_3$ or $N_2+O_2$. Alternatively, the source gas may comprise a compound selected from the group consisting of $H_2$, $NH_3$ and $PH_3$, but this source gas may also contain a compound selected from the group consisting of Ar, $N_2$, $O_2$ and $N_2O$. According to another preferred aspect of the present invention, the exposing step is followed by the step of thermally annealing the capacitor at a temperature no greater than 750° C. to improve the electrical characteristics of the capacitor.

According to another embodiment of the present invention, methods of forming an integrated circuit capacitor include the steps of forming a first capacitor electrode on a semiconductor substrate and then forming a layer of BST on the first capacitor electrode using a first plasma. A second capacitor electrode is then formed on the layer of BST. A step is then performed to expose at least one of the layer of BST and the second capacitor electrode, to a second plasma for a duration of sufficient length to improve charge leakage characteristics of the layer of BST. Here, the first plasma preferably contains a 9:1 ratio of Ar to $O_2$ and the step of forming a layer of BST preferably includes the step of maintaining a temperature of the substrate at about 450° C.

Using these preferred methods, integrated circuit capacitors can be achieved having substantially improved current leakage characteristics and little or no deterioration in capacitance characteristics even when high dielectric materials are used to increase capacitance values.

DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate, or intervening layers may also be present. Like numbers refer to like elements throughout.

Figure 1:
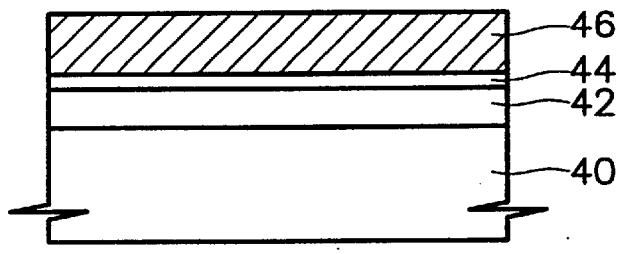
FIGS. 1–4 are cross-sectional views of intermediate structures which illustrate a method of forming a capacitor according to a first embodiment of the present invention.

FIG. 1 shows a step of forming a first electrode 46 of a capacitor. In detail, an interlayer dielectric film 42 having a predetermined thickness is formed on a surface of a semiconductor substrate 40. A contact hole (not shown) which exposes a portion of the semiconductor substrate is formed in the interlayer dielectric film 42. A conductive material layer (not shown) is then formed in the contact hole and on the entire surface of the interlayer dielectric film 42. The conductive material layer is then planarized until the interlayer dielectric film 42 is exposed. As a result, the conductive material layer is removed from the entire surface of the interlayer dielectric film 42, but the conductive material layer is not removed from the contact hole. Accordingly, a conductive plug is formed in the contact hole. The conductive plug may be formed of a material selected from the group consisting of silicon (Si), tantalum (Ta), ruthenium (Ru), iridium (Ir), osmium (Os), tungsten silicide (WSi) and combinations thereof.

A conductive barrier layer 44 having a predetermined thickness is then formed on the entire surface of the interlayer dielectric film 42. The interlayer dielectric film 42 is formed to a thickness of approximately 1,000 Å using a silicon oxide film ($SiO_2$). The conductive barrier layer 44 is formed of TiN and has a thickness of approximately 500 Å. Then, a first electrode 46 (for a lower electrode of the capacitor) is formed on the entire surface of the resultant structure where the conductive barrier layer 44 is formed. The first electrode 46 is preferably formed of a refractory metal, a refractory metal oxide or combinations thereof. Preferably, the first electrode 46 is formed of a platinum group metal. A platinum group metal may be a metal selected from a group consisting of platinum (Pt), ruthenium (Ru), iridium (Ir), rhodium (Rh), osmium (Os) and palladium (Pd). According to an embodiment of the present invention, the first electrode 46 is formed as a first Pt layer. In a vacuum chamber having an inner pressure of, for example, 4 mTorr, the first Pt layer is formed on the entire surface of the conductive barrier layer 44 by a plasma generated from a source gas. Here, an Ar plasma may be generated and a platinum source may be provided. At this time, the temperature of the substrate 40 is kept at 300° C.

Figure 2:
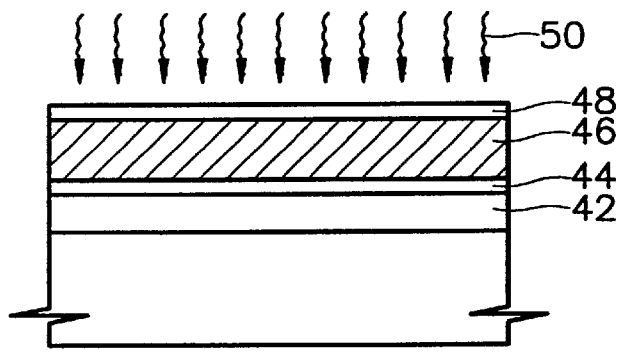

FIG. 2 shows a step of plasma-processing a surface of a dielectric layer 48. In particular, after the first electrode 46 is formed, a dielectric layer 48 is formed on the entire surface of the resultant structure where the first electrode 46 is formed. At this time, the dielectric layer 48 may be formed as a $SrTiO_3$ (STO) layer, a $(Ba, Sr)TiO_3$ (BST) layer, a $Pb(Zr, Ti)O_3$ (PZT) layer, a $SrBi_2Ta_2O_9$(SBT) layer, a $(Pb, La)(Zr, Ti)O_3$ (PLZT) layer, a $Bi_4Ti_3O_{12}$ (BTO) layer or a layer containing combinations of these materials. The dielectric layer 48 can be formed using a method selected from the group consisting of a sputtering method, a chemical vapor deposition (CVD) method, or a sol-gel method, for example.

According to an embodiment of the present invention, the dielectric layer 48 is formed as a BST layer. The BST layer may be formed on the entire surface of the first electrode 46 using an RF sputtering method. At this time, the chamber is maintained at a pressure close to vacuum, for example, approximately 10 mTorr, and the substrate is maintained at a temperature of 450° C. An RF-plasma formed from a mixed gas of argon (Ar) and $O_2$ in a ratio of 9 to 1, is then formed in the chamber, and then it is sputtered onto the BST layer source. This results in the formation of a BST layer on the entire surface of the first electrode 46. As a result, a dielectric layer 48 of approximately 400 Å can be formed.

The surface of the dielectric layer 48 is then processed using a plasma 50 to improve the electrical characteristics of the capacitor. The plasma 50 is formed using microwaves generated by electron cyclotron resonance (ECR). In detail, the plasma is formed using microwaves formed by ECR at a frequency of 2.45 Giga Hz. At this time, at least 0.1 kW of power is supplied, the chamber pressure is maintained at 0.01 Torr or higher, and the temperature of the semiconductor substrate is 700° C. or less. Alternatively, an RF-plasma may be used as the plasma 50.

A gas comprising oxygen atoms or hydrogen atoms is preferably used as the source gas for the plasma. The source gas comprising oxygen atoms contains gases selected from the group consisting of $N_2O$, $O_2$, $O_3$, CO, $CO_2$. The source gas may also comprise $N_2O$, $O_2$, $O_3$, $CO_2$ or CO with an additional compound selected from the group consisting of Ar, $NH_3$, He and $N_2$. For example, $N_2O+N_2$, $N_2O+NH_3$ or $N_2+O_2$ may be used as the source gas.

The source gas may also comprise hydrogen atoms. Here, the source gas may comprise $H_2$, $NH_3$ or $PH_3$. The source gas may also be a mixture which comprises one compound selected from the group consisting of $H_2$, $NH_3$ and $PH_3$ with at least one compound selected from the group consisting of Ar, $N_2$, $O_2$ and $N_2O$. For example, a source gas mixture may be formed of $NH_3+Ar$, $N_2O+NH_3$ or $NH_3+O_2$.

As determined by the inventors herein, damage caused to a material by an ECR plasma is typically less than the amount of damage caused by a RF plasma. As will be understood by those skilled in the art, an RF plasma is formed by applying a voltage difference between an anode and a cathode (which is the substrate). On the other hand, an ECR plasma may be formed by shifting the acceleration of electrons without biasing the substrate, thus less damage may be caused to the substrate or to thin films formed on the substrate.

According to an aspect of the present invention, Ar and N₂O are used as the source gas for the ECR plasma, where the source gas is supplied at 250 sccm and the chamber pressure is held at 10 mTorr. The ECR power is approximately 1,200 Watts, and the temperature of the substrate 40 is held at level less than 200° C. to inhibit damage to the substrate. Under the above conditions, the surface of the dielectric layer 48 is exposed to an ECR plasma for a duration in a range between about 0.1 and 10 minutes, and more preferably about 30 seconds. While the surface of the dielectric layer 48 is exposed to the plasma, the distance between the substrate 40 and an upper panel to which the plasma is applied, is approximately 3.5 cm.

Figure 3:
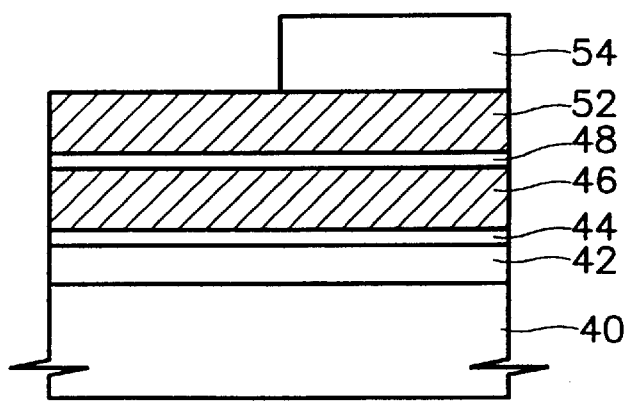

Referring now to FIG. 3, after forming and plasma processing the dielectric layer 48, the second capacitor electrode 52 is formed on the entire surface of the dielectric layer 48. The second electrode 52, like the first electrode 46, can be formed of a refractory metal such as a metal of the platinum group, an oxide thereof or combinations of platinum group metals. According to the embodiment of the present invention, the second electrode 52 is formed as a second platinum layer. The second platinum layer is formed under the same conditions used to form the first platinum layer. However, the second platinum layer is preferably formed to be only 1000 Å thick whereas the first platinum layer 46 is formed as a layer having a thickness greater than 1000 Å.

Figure 4:
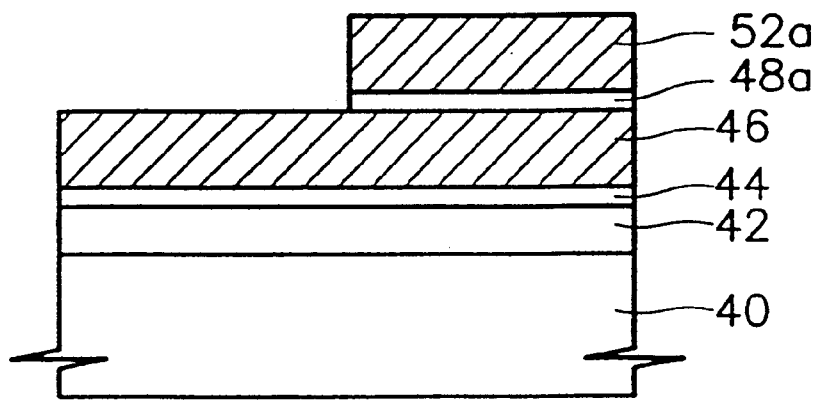

A photosensitive layer (not shown) is then formed to cover the entire surface of the second electrode 52. The photosensitive layer is then patterned to form a photosensitive layer pattern 54 on a predetermined portion of the second electrode 52. FIG. 4 shows a step of forming a second electrode pattern 52a and a dielectric layer pattern 48a. In detail, the exposed portion of the surface of the second electrode 52 is dry etched using the photosensitive layer pattern 54 of FIG. 3 as a mask, until the interface with the first electrode 46 is exposed. Then, the photosensitive layer pattern 54 is removed to expose a dielectric layer pattern 48a and a second electrode pattern 52a on a predetermined portion of the first electrode 46, as shown in FIG. 4.

In order to improve the crystalline property of the dielectric layer pattern 48a and stabilize the interface between the dielectric layer pattern 48a and the second electrode pattern 52a, a heat-treatment process is performed after forming the dielectric layer pattern 48a and the second electrode pattern 52a. In detail, the resultant structure on which the second electrode pattern 52a is formed is heat-treated using a furnace thermal treatment step or a rapid thermal annealing step. At this time, a quartz tube furnace is used for the above furnace. The thermal annealing process is preferably performed in a nitride ambient at 750° C. for 30 minutes.

Figure 5:
FIG. 5 is a cross-sectional view of an intermediate structure which illustrates a method of forming a capacitor according to a second embodiment of the present invention.
Figure 5:
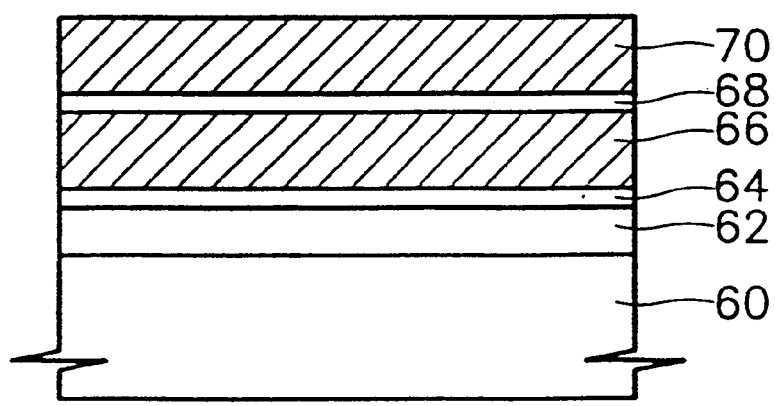

Hereinafter, a method for fabricating a capacitor of a semiconductor device will be described with reference to FIG. 5. In detail, the step of sequentially forming an interlayer dielectric 62, a conductive barrier layer 64, a first electrode 66 and a dielectric layer 68 on a semiconductor substrate 60 are the same as that of the first embodiment. However, in accordance with the second embodiment, a second electrode 70 (as an upper electrode of a capacitor) is formed on the entire surface of the dielectric layer 68 to prevent the dielectric layer 68 from being exposed to a plasma 72 during a subsequent process step. Then, the second electrode 70 is treated using the plasma 72. The plasma 72 is an ECR plasma or RF plasma. The source gas of the plasma 72 is the same as the source gas described with respect to the first embodiment of the present invention. At this time, the second electrode 70 protects the dielectric layer 68. Therefore, potential damage to the dielectric layer 68 (which may occur in the first embodiment) can be prevented. Subsequent processes are performed in the same manner as the first embodiment.

As described above, the dielectric layer or the surface of the second electrode is treated using a preferred ECR plasma. Therefore, defects in the dielectric layer and contamination of the surface of the dielectric layer by carbon or hydrogen, for example, can be removed. Also, the temperature of the thermal annealing step can be lowered to 750° C. or less to improve capacitor characteristics.

Hereinafter, a comparison of the electrical characteristics of integrated circuit capacitors fabricated using conventional techniques and the electrical characteristics of capacitors fabricated in accordance with an embodiment of the present invention, will be described. FIGS. 6 through 10 are graphs showing leakage current density versus voltage characteristics for capacitors formed using conventional methods and methods in accordance with the present invention.

Figure 6:
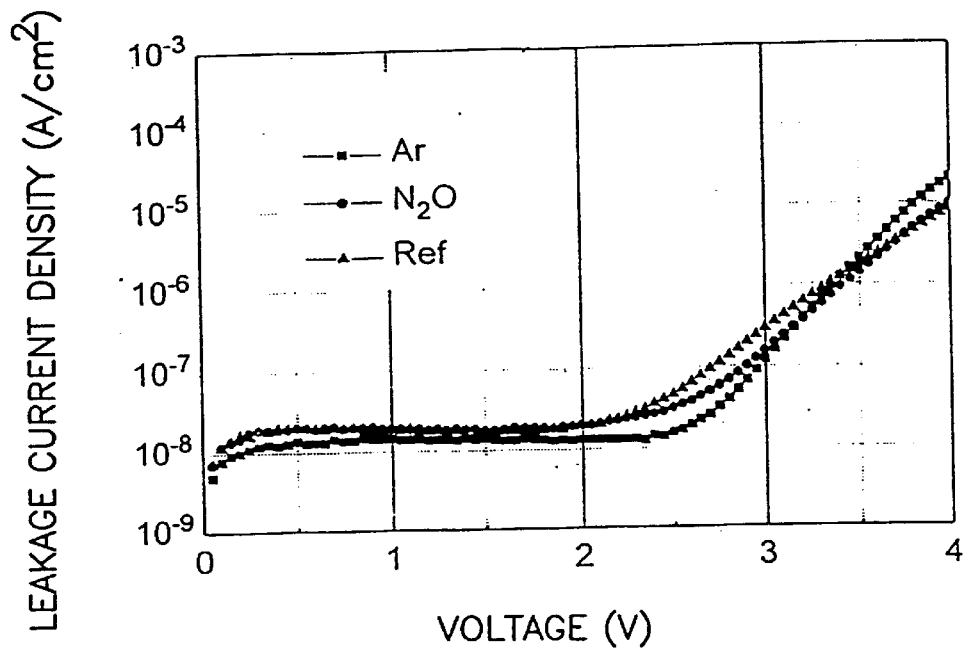
FIG. 6 contains graphs showing leakage current densities versus positive voltage for capacitors formed using conventional or preferred methods and maintained at 25° C. during measurement.

In FIG. 6, the horizontal axis indicates a (+) voltage applied to the capacitor and the vertical axis indicates the leakage current density. Reference symbol ▲ indicates the relationship between leakage current density and applied voltage for a conventional capacitor (i.e., Ref), and reference symbols ■ and ● apply to capacitors exposed to an ECR Argon plasma and an ECR N₂O plasma, respectively, according to the present invention. Referring to FIG. 6, for positive applied voltages, the curves are similar inasmuch as the leakage current density for all samples increases at about 2.5 Volts.

Figure 7:
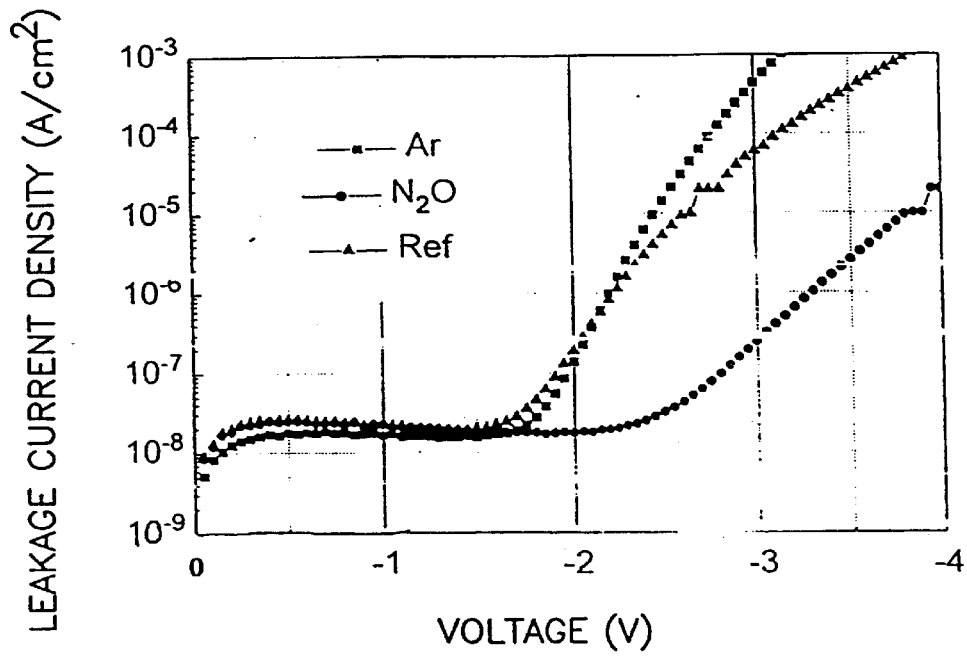
FIG. 7 contains graphs showing leakage current densities versus negative voltage for capacitors formed using conventional or preferred methods and maintained at 25° C. during measurement.

Referring to FIG. 7, the application of negative voltages to the capacitors illustrates differences in the leakage current density versus voltage characteristics of the capacitors. In particular, both the capacitor formed using the conventional method (e.g., Ref) and the capacitor formed using an Ar plasma treatment step show an increase in leakage current density at about −1.8 Volts. However, the capacitor formed using an N₂O plasma treatment step shows dramatically lower leakage current densities at voltages below −1.8 Volts. In fact, the rapid increase in leakage current density for the capacitor receiving the N₂O plasma treatment step does not begin to take place until about −2.5 Volts. Thus, at least a 0.7 Volt improvement can be achieved by exposing capacitors to N₂O plasmas during processing. Moreover, the capacitors receiving plasma treatment maintain substantially symmetrical leakage current characteristics for voltages in a range from −1.5 Volts to 1.5 Volts.

Figure 8:
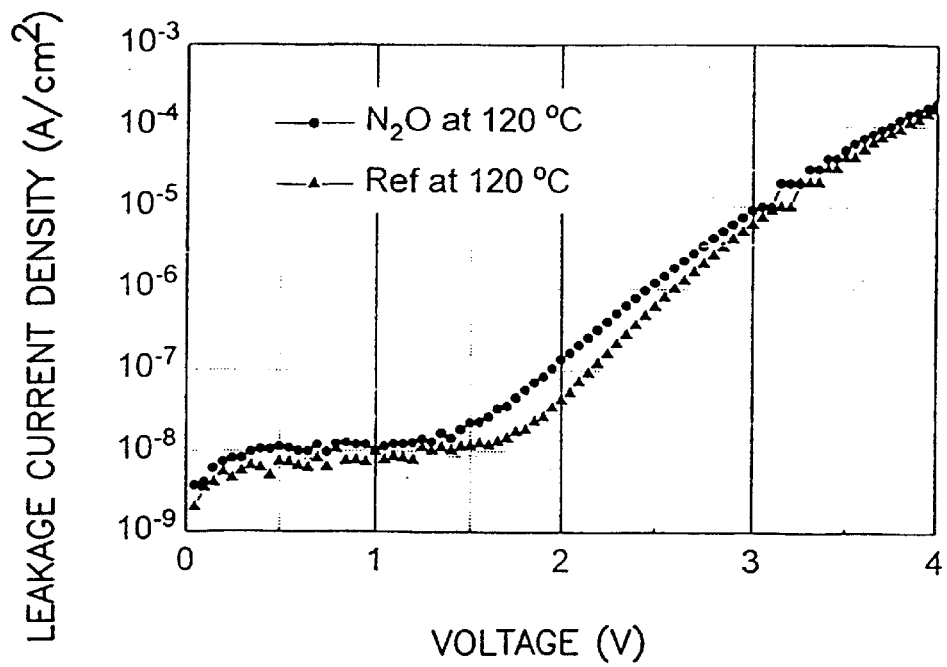
FIG. 8 contains graphs showing leakage current densities versus positive voltage for capacitors formed using conventional or preferred methods and maintained at 120° C. during measurement.
Figure 9:
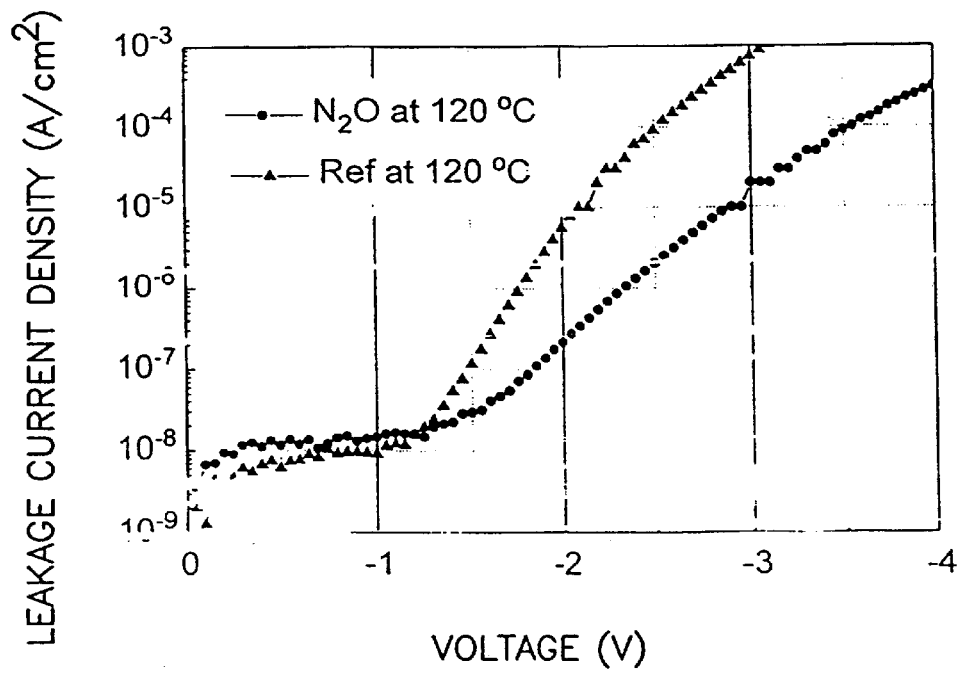
FIG. 9 contains graphs showing leakage current densities versus negative voltage for capacitors formed using conventional or preferred methods and maintained at 120° C. during measurement.

Referring now to FIGS. 8–9, the leakage current density versus voltage characteristics (+ and −) are obtained again while maintaining the temperature of the substrate on which the capacitors are formed at 120° C. Here, the capacitors include a capacitor formed in accordance with a conventional method and a capacitor formed using a N₂O plasma treatment step. In comparison to FIGS. 6–7, it can be seen that the characteristics for both capacitors deteriorate at higher temperatures and the "knees" in all curves shift towards 0 Volts. But, again, as illustrated best by FIG. 9, the characteristics of the capacitor receiving the plasma treatment are much improved relative to the conventional capacitor.

Figure 10:
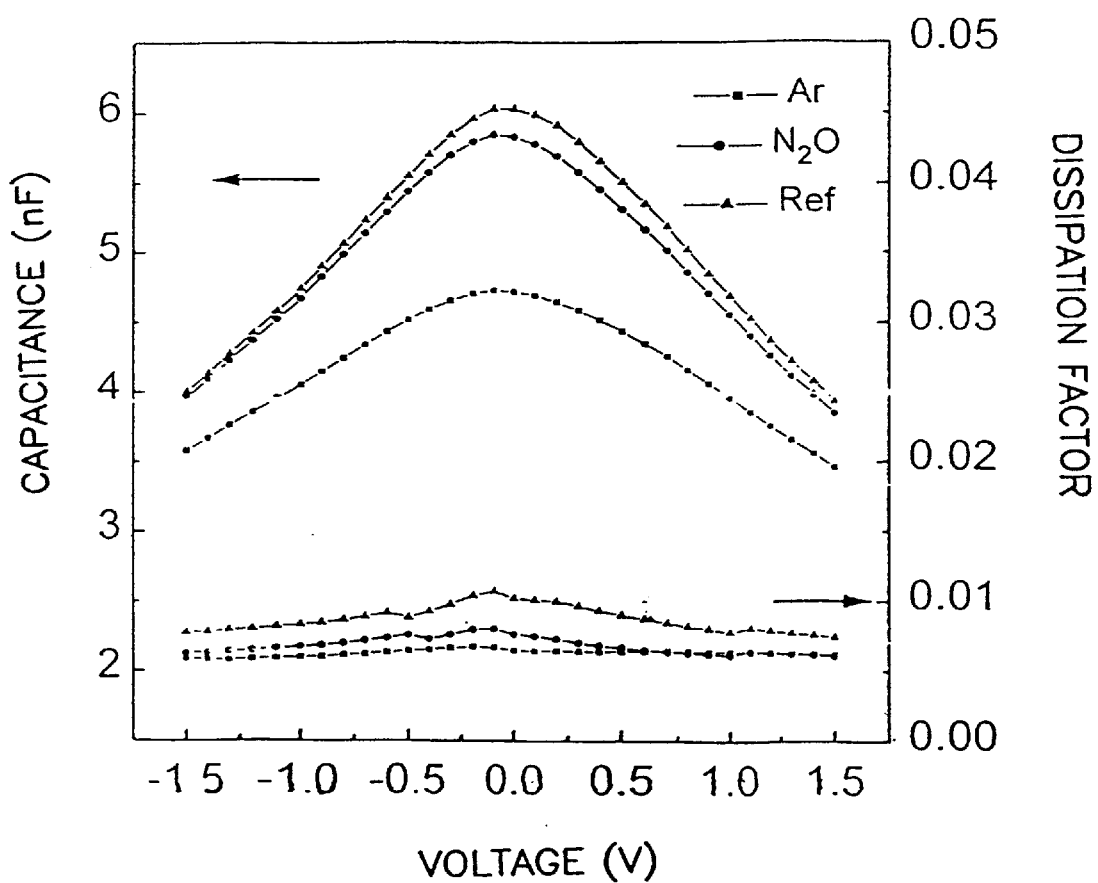
FIG. 10 contains graphs showing variation in capacitance (and dissipation factor) as a function of voltage for capacitors formed using conventional or preferred methods.

Referring to FIG. 10, graphs of the capacitance of capacitors undergoing conventional treatment, Argon plasma treatment and N₂O plasma treatment, versus voltage are provided. Here, the left vertical axis of the graph defines the capacitance value and the horizontal axis defines (−) and (+)

voltages. In addition, FIG. 10 provides graphs of the dissipation factor of the capacitors undergoing conventional treatment, Argon plasma treatment and $N_2O$ plasma treatment, versus voltage. Here, the right vertical axis of the graph defines the value of the dissipation factor. As illustrated, the characteristics of the capacitor formed using the conventional method and the capacitor receiving the $N_2O$ plasma treatment has similar characteristics. Although not wishing to be bound by any theory, it is believed that these similar characteristics illustrate that plasma treatment using an $N_2O$ plasma does not deteriorate the dielectric layer of the capacitor. In contrast, plasma treatment using an Ar plasma may deteriorate the dielectric layer as evidenced by the lower capacitance values and dissipation factor values associated with the capacitor receiving treatment with an argon plasma. Accordingly, as illustrated by FIGS. 6–9, plasma treatment using an $N_2O$ plasma improves the leakage current characteristics of a capacitor, but does not significantly adversely impact capacitance characteristics.

Figure 11:
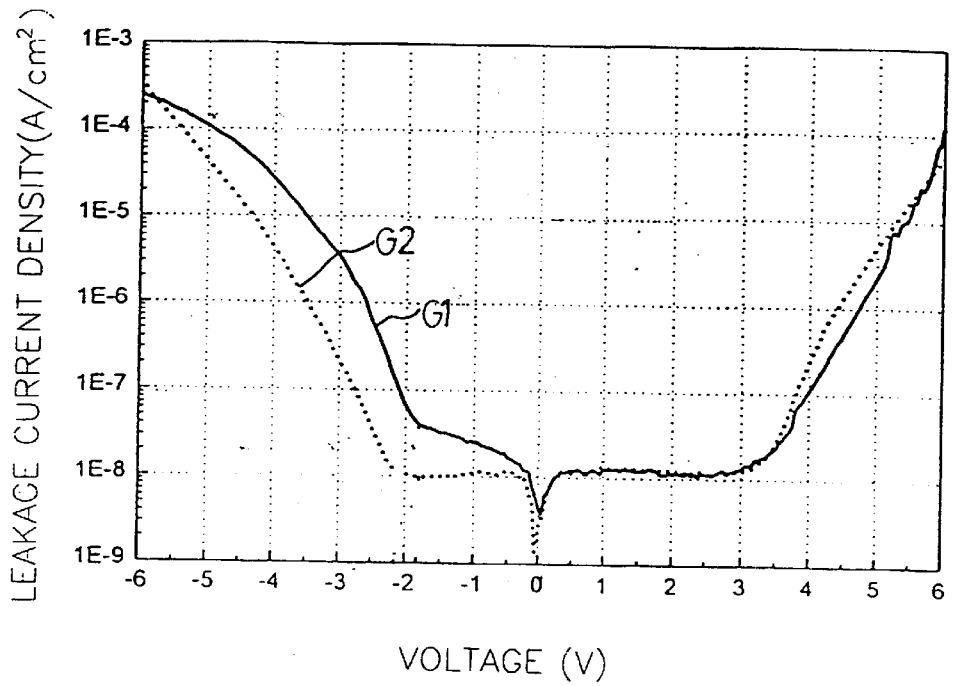
FIG. 11 contains graphs showing leakage current densities versus voltage for capacitors formed using conventional or preferred methods.

In FIG. 11, graphs of leakage current density versus voltage ((−) and (+)) are provided for a capacitor (G1) fabricated using a conventional method and a capacitor (G2) receiving a preferred ECR plasma treatment step with a source gas containing hydrogen (e.g., ammonia). Like the curves of FIGS. 6–7, the leakage current characteristics of the capacitor receiving a preferred ECR plasma are substantially improved at negative voltages, and are about equal to the characteristics of the conventional capacitor at positive voltages.

Figure 12:
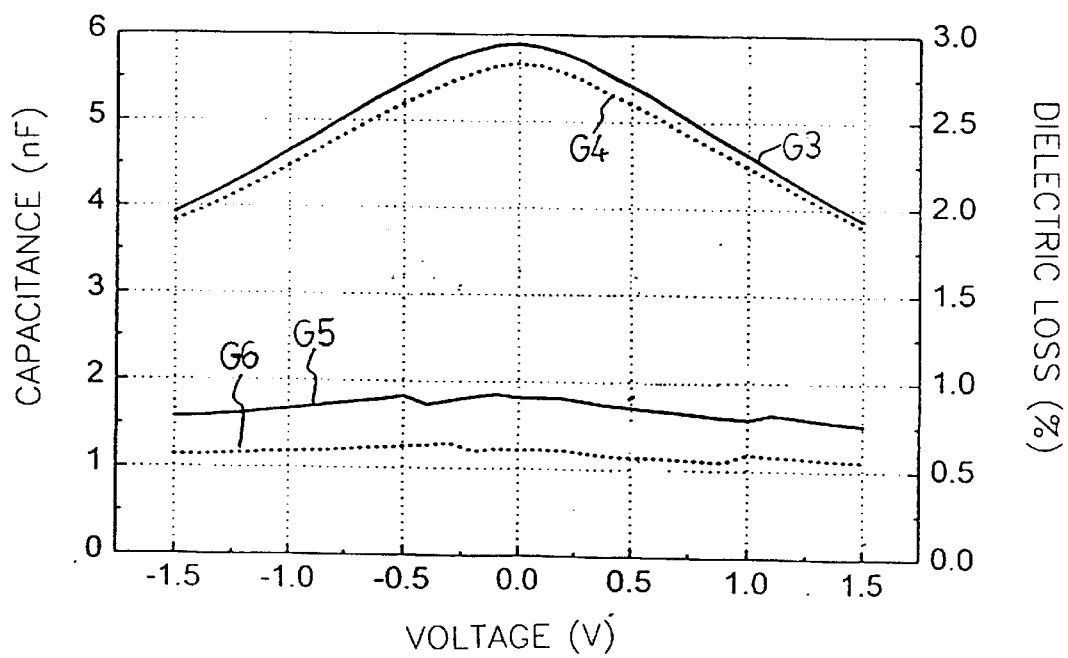
FIG. 12 contains graphs showing variation in capacitance (and dielectric loss) as a function of voltage for capacitors formed using conventional or preferred methods.

Referring to FIG. 12, graphs of the capacitance of capacitors undergoing conventional treatment and ammonia plasma treatment versus voltage are provided. Here, the left vertical axis of the graph defines the capacitance value and the horizontal axis defines (−) and (+) voltages. In addition, FIG. 12 provides graphs of the dielectric loss of the capacitors undergoing conventional treatment and ammonia plasma treatment. Here, the right vertical axis of the graph defines the value of the dielectric loss.

In particular, the third graph G3 (drawn with a solid line) and a fourth graph G4 (drawn with a dashed line) are respective graphs showing variations of the capacitance of a capacitor according to the conventional technology and a capacitor containing a dielectric layer is treated with an ammonia plasma according to the present invention. Also, a fifth graph G5 and a sixth graph G6 are graphs showing a dielectric loss of a dielectric layer in a capacitor according to the conventional technology and the present invention. With reference to the third graph G3 and fourth graph G4, the capacitance difference between the present invention and the conventional technology is small. With reference to the fifth graph G5 and sixth graph G6, the dielectric loss of the dielectric layer of the present invention is 0.6% or so. On the other hand, that of the conventional technology is 0.9% or so. As a result, the dielectric loss of the present invention is less than that of the conventional technology by 0.3% or so. Accordingly, when the dielectric layer surface of a capacitor is treated with an ammonia plasma, leakage current characteristics and dielectric loss characteristics are improved.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit capacitor, comprising the steps of:

forming a capacitor comprising first and second electrodes and a dielectric layer between the first and second electrodes, on a substrate; and exposing at least one of the dielectric layer and the second electrode to an ECR plasma for a duration of sufficient length to improve charge leakage characteristics of the integrated circuit capacitor and under conditions which prevent etching and removal of the at least one of the dielectric layer and the second electrode.

2. The method of claim 1, wherein said exposing step comprises selectively exposing the second electrode, but not the dielectric layer, to the ECR plasma.

3. The method of claim 1, wherein the ECR plasma is formed using an ECR microwave having a frequency of 2.45 GHz and supplied with at least 0.1 kWatts of power.

4. The method of claim 1, wherein said exposing step is performed while simultaneously maintaining the substrate at a temperature below about 700° C.

5. The method of claim 1, wherein the ECR plasma is established using a source gas comprising a compound selected from the group consisting of $N_2O$, $O_2$, $O_3$, CO and $CO_2$.

6. The method of claim 5, wherein the source gas also comprises a compound selected from the group consisting of Ar, $N_2$, He and $NH_3$.

7. The method of claim 6, wherein the ECR plasma comprises an ECR microwave plasma having a frequency of 2.45 GHz and supplied with at least 0.1 kWatts of power.

8. The method of claim 1, wherein the ECR plasma is established using a source gas comprising a mixture of gases selected from the group consisting of $N_2O+N_2$, $N_2O+NH_3$ and $N_2+O_2$.

9. The method of claim 1, wherein the ECR plasma is established using a source gas comprising a compound selected from the group consisting of $H_2$, $NH_3$ and $PH_3$.

10. The method of claim 9, wherein the source gas also comprises a compound selected from the group consisting of Ar, $N_2$, $O_2$ and $N_2O$.

11. The method of claim 1, wherein the dielectric layer comprises a material selected from the group consisting of STO, BST, PZT, SBT, PLZT and BTO.

12. The method of claim 1, wherein the first and second electrodes comprise a platinum group metal.

13. The method of claim 1, wherein said exposing step is followed by the step of thermally annealing the capacitor at a temperature no greater than 750° C.

14. A method of forming an integrated circuit capacitor, comprising the steps of:

forming a first capacitor electrode on a semiconductor substrate;

forming a layer of BST on the first capacitor electrode using a first plasma;

forming a second capacitor electrode on the layer of BST; and exposing at least one of the layer of BST and the second capacitor electrode to a second plasma for a duration of sufficient length to improve charge leakage characteristics of the layer of BST and under conditions that prevent etching and removal of the at least one of the layer of BST and the second capacitor electrode.

15. The method of claim 14, wherein the first plasma contains a 9:1 ratio of Ar to $O_2$.

16. The method of claim 14, wherein said step of forming a layer of BST comprises maintaining a temperature of the substrate at about 450° C.

17. The method of claim 14, wherein said step of forming a layer of BST comprises forming a layer of BST having a thickness of about 400 Å.

18. The method of claim 14, wherein said exposing step comprises selectively exposing the second capacitor electrode, but not the layer of BST, to the second plasma.

19. The method of claim 14, wherein the second plasma is an ECR plasma.

20. The method of claim 19, wherein the ECR plasma is formed using an ECR microwave having a frequency of 2.45 GHz and supplied with at least 0.1 kWatts of power.

21. The method of claim 14, wherein said exposing step is performed while simultaneously maintaining the substrate at a temperature below about 700° C.

22. The method of claim 14, wherein the second plasma is established using a source gas comprising a compound selected from the group consisting of $N_2O$, $O_2$, $O_3$, CO and $CO_2$.

23. The method of claim 22, wherein the source gas also comprises a compound selected from the group consisting of Ar, $N_2$, He and $NH_3$.

24. The method of claim 14, wherein the second plasma is established using a source gas comprising a mixture of gases selected from the group consisting of $N_2O+N_2$, $N_2O+NH_3$ and $N_2+O_2$.

25. The method of claim 14, wherein the second plasma is established using a source gas comprising a compound selected from the group consisting of $H_2$, $NH_3$ and $PH_3$.

26. The method of claim 24, wherein the source gas also comprises a compound selected from the group consisting of Ar, $N_2$, $O_2$ and $N_2O$.

27. The method of claim 14, wherein said exposing step is followed by the step of thermally annealing the layer of BST at a temperature no greater than 750° C.

28. A method of forming an integrated circuit capacitor, comprising the steps of:
    forming a capacitor comprising first and second electrodes and a dielectric layer between the first and second electrodes, on a substrate; and
    exposing at least one of the dielectric layer and the second electrode to an ECR plasma for a duration of sufficient length to improve charge leakage characteristics of the integrated circuit capacitor, said ECR plasma established using a source gas comprising a mixture of gases selected from the group consisting of $N_2O+N_2$, $N_2O+NH_3$ and $N_2+O_2$.

29. A method of forming an integrated circuit capacitor, comprising the steps of:
    forming a capacitor comprising first and second electrodes and a dielectric layer between the first and second electrodes, on a substrate; and
    exposing at least one of the dielectric layer and the second electrode to an ECR plasma for a duration of sufficient length to improve charge leakage characteristics of the integrated circuit capacitor, said ECR plasma established using a source gas comprising a compound selected from the group consisting of $H_2$, $NH_3$ and $PH_3$.

30. The method of claim 29, wherein the source gas also comprises a compound selected from the group consisting of Ar, $N_2$, $O_2$ and $N_2O$.

31. The method of claim 29, wherein said exposing step comprises selectively exposing the second electrode, but not the dielectric layer, to the ECR plasma.

32. The method of claim 29, wherein the ECR plasma is formed using an ECR microwave having a frequency of 2.45 GHz and supplied with at least 0.1 kWatts of power.

33. The method of claim 29, wherein said exposing step is performed while simultaneously maintaining the substrate at a temperature below about 700° C.

34. A method of forming an integrated circuit capacitor, comprising the steps of:
    forming a first capacitor electrode on a semiconductor substrate;
    forming a layer of BST on the first capacitor electrode using a first plasma comprising a 9:1 ratio of Ar to $O_2$;
    forming a second capacitor electrode on the layer of BST; and
    exposing at least one of the layer of BST and the second capacitor electrode to a second plasma for a duration of sufficient length to improve charge leakage characteristics of the layer of BST.

35. The method of claim 34, wherein said step of forming a layer of BST comprises maintaining a temperature of the substrate at about 450° C.

36. The method of claim 34, wherein said step of forming a layer of BST comprises forming a layer of BST having a thickness of about 400 Å.

37. The method of claim 34, wherein said exposing step comprises selectively exposing the second capacitor electrode, but not the layer of BST, to the second plasma.

38. The method of claim 34, wherein the second plasma is an ECR plasma.

39. The method of claim 34, wherein said exposing step is performed while simultaneously maintaining the substrate at a temperature below about 700° C.

40. A method of forming an integrated circuit capacitor, comprising the steps of:
    forming a first capacitor electrode on a semiconductor substrate;
    forming a layer of BST on the first capacitor electrode using a first plasma;
    forming a second capacitor electrode on the layer of BST; and
    exposing at least one of the layer of BST and the second capacitor electrode to a second plasma for a duration of sufficient length to improve charge leakage characteristics of the layer of BST, said second plasma established using a source gas comprising a mixture of gases selected from the group consisting of $N_2O+N_2$, $N_2O+NH_3$ and $N_2+O_2$.

41. A method of forming an integrated circuit capacitor, comprising the steps of:
    forming a first capacitor electrode on a semiconductor substrate;
    forming a layer of BST on the first capacitor electrode using a first plasma;
    forming a second capacitor electrode on the layer of BST; and
    exposing at least one of the layer of BST and the second capacitor electrode to a second plasma for a duration of sufficient length to improve charge leakage characteristics of the layer of BST, said second plasma established using a source gas comprising a compound selected from the group consisting of $H_2$, $NH_3$ and $PH_3$.

42. The method of claim 41, wherein the source gas also comprises a compound selected from the group consisting of Ar, $N_2$, $O_2$ and $N_2O$.

* * * * *